US009732425B2

(12) United States Patent
Park et al.

(10) Patent No.: US 9,732,425 B2
(45) Date of Patent: Aug. 15, 2017

(54) APPARATUS FOR COATING NANOPARTICLES HAVING CORE-SHELL STRUCTURE USING ATOMIC LAYER DEPOSITION

(71) Applicant: Daejin University Center for Educational Industrial Cooperation, Pocheon-si, Gyeonggi-do (KR)

(72) Inventors: Sungho Park, Goyang-si (KR); Won-Seok Chae, Pocheon-si (KR); Man So Han, Seonsan-si (KR)

(73) Assignee: Daejin University Center for Educational Industrial Cooperation, Pocheon-si, Gyeonggi-Do (KR)

( * ) Notice: Subject to any disclaimer, the term of this patent is extended or adjusted under 35 U.S.C. 154(b) by 378 days.

(21) Appl. No.: 14/487,110

(22) Filed: Sep. 16, 2014

(65) Prior Publication Data
US 2015/0075429 A1 Mar. 19, 2015

(30) Foreign Application Priority Data
Sep. 16, 2013 (KR) .................. 10-2013-0110863

(51) Int. Cl.
*C23C 16/455* (2006.01)
*C23C 16/52* (2006.01)
(Continued)

(52) U.S. Cl.
CPC .. *C23C 16/45551* (2013.01); *C04B 35/62802* (2013.01); *C23C 16/4417* (2013.01);
(Continued)

(58) Field of Classification Search
CPC .......... C23C 16/45551; C23C 16/4417; C23C 16/45555; C23C 16/52; C23C 16/45502;
(Continued)

(56) References Cited

U.S. PATENT DOCUMENTS

| 5,201,956 A  *  4/1993 | Humphrey ............ C23C 16/44 |
|---|---|
| | 118/500 |
| 2013/0316077 A1* 11/2013 | Dassel ................... B01J 8/1809 |
| | 427/213 |

FOREIGN PATENT DOCUMENTS

| KR | 10-2012-0028051 A | 3/2012 |
| KR | 10-2012-0139375 A | 12/2012 |
| KR | 10-1247968 B1 | 4/2013 |

OTHER PUBLICATIONS

Scientific Treatise "Nano Technology Development Trend: Core-Shell Nanoparticle" Korean Journal of Industrial and Engineering Chemistry, vol. 12, No. 3, pp. 23-37, 2009.

* cited by examiner

*Primary Examiner* — Rudy Zervigon
(74) *Attorney, Agent, or Firm* — Revolution IP, PLLC (57) ABSTRACT

Disclosed is a coating chamber having a process passage in which a coating process is performed, a particle supply means configured to supply nanoparticles into the process passage, a gas supply means configured to supply a carrier gas and a reactive gas serving as a source of a shell material into the process passage, and a low pressure forming means configured to form a low pressure in the process passage. The coating chamber has a speed adjustment member formed of a porous material or a grid and installed in the process passage, and as a moving speed of the nanoparticles is decreased due to flow resistance or collision of the nanoparticles passing through the speed adjustment member, first and second precursors supplied as the reactive gas move more rapidly than the nanoparticles to coat a thin film on the nanoparticles with the material.

9 Claims, 7 Drawing Sheets

(51) Int. Cl.
 *C04B 35/628* (2006.01)
 *C23C 16/44* (2006.01)
 *H01J 37/32* (2006.01)

(52) U.S. Cl.
 CPC .. *C23C 16/45502* (2013.01); *C23C 16/45555* (2013.01); *C23C 16/52* (2013.01); *H01J 37/321* (2013.01); *H01J 37/32357* (2013.01); *C04B 2235/32* (2013.01); *C04B 2235/3852* (2013.01)

(58) Field of Classification Search
 CPC .............. H01J 37/321; H01J 37/32357; C04B 35/62802; C04B 2235/32; C04B 2235/3852
 USPC ........................................ 118/715; 156/345.1
 See application file for complete search history.

APPARATUS FOR COATING NANOPARTICLES HAVING CORE-SHELL STRUCTURE USING ATOMIC LAYER DEPOSITION

CROSS-REFERENCE TO RELATED APPLICATION

This application claims priority to and the benefit of Korean Patent Application No. 2013-0110863, filed on Sep. 16, 2013, the disclosure of which is incorporated herein by reference in its entirety.

BACKGROUND

1. Field of the Invention

The present invention relates to a technology of manufacturing nanoparticles having a core-shell structure, and more particularly, to an apparatus for coating nanoparticles having a core-shell structure using atomic layer deposition capable of coating high purity nanoparticles having high uniformity and small deviation and improving productivity of a coating process.

2. Discussion of Related Art

Nanoparticles are a core material needed for commercializing technologies in various fields including those of biosensors, fluorescent substances of next generation displays, solar cells, and nano electronic devices.

Among these, core-shell nanoparticles have a structure in which a shell-forming material surrounds a core material disposed at a center thereof, and properties and development trends of the core-shell nanoparticles are disclosed in Non-Patent Literature 1. For example, the nanoparticles having the core-shell structure are different from a simple mixture or an alloy of at least two materials. Since nano materials having complex functions representing at least two properties can be provided according to which material having a certain property is used for each of a core and a shell, research on the nanoparticles having the core-shell structure by various combinations of metal-metal, metal-ceramic, metal-organic matter, and organic matter-organic matter structures have been accomplished. It is being shown that the nanoparticles having the core-shell structure can be easily applied in various fields due to complex functions obtained by combining properties such as a magnetic property, a fluorescent property, acid resistance, wear resistance, and so on.

Meanwhile, various methods for manufacturing nanoparticles having a core-shell structure have been proposed, and for example, Patent Literature 1 discloses a technology that can be operated in different pressure ranges and that can control a thickness coated on core particles in a low pressure particle coating process in real time by installing a pressure separating means between a core material manufacturer and a particle coating reactor.

However, the related art including the related documents has a problem that the sizes of the generated nanoparticles are irregular because the nanoparticles having the core-shell structure are still developed on a laboratory level, and the particle size is increased and becomes irregular because time elapses in a state in which the reaction on the surfaces of the generated nanoparticles is not completely terminated.

Accordingly, process equipment and a manufacturing method that are capable of manufacturing high purity nanoparticles having high uniformity by reducing deviation between particles, collecting the particles at high yield to be appropriate for mass production, and improving productivity are acutely needed.

In addition, since a thickness of the shell material coated on the nanoparticles can be easily and simply adjusted, reduction in cost due to implementing of process equipment and stabilization of the manufacturing process should be attempted.

CITATION LIST

Patent Literature (Patent Literature 1) [Patent Literature 1] Korean Patent Registration No. 10-1247968 (Published on Apr. 3, 2013)

Non-Patent Literature (Non-Patent Literature 1) [Non-Patent Literature 1] Scientific Treatise "Nano Technology Development Trend: Core-Shell Nanoparticle" Korean Journal of Industrial and Engineering Chemistry, Volume 12, Part 3, Pages 23-3, 2009.

SUMMARY OF THE INVENTION

The present invention is directed to provide an apparatus for coating nanoparticles having a core-shell structure using atomic layer deposition capable of coating high purity nanoparticles having high uniformity and small deviation and improving productivity of a coating process.

According to an aspect of the present invention, there is provided an apparatus for coating nanoparticles having a core-shell structure using atomic layer deposition, the apparatus including: a coating chamber having a process passage in which a coating process is performed; a particle supply means configured to supply the nanoparticles into the process passage; a gas supply means configured to supply a carrier gas and a reactive gas serving as a source of a shell material into the process passage; and a low pressure forming means configured to form a low pressure in the process passage, wherein the coating chamber has a speed adjustment member formed of a porous material or a grid and installed in the process passage, and as a moving speed of the nanoparticles is decreased due to flow resistance or collision of the nanoparticles passing through the speed adjustment member, first and second precursors supplied as the reactive gas move more rapidly than the nanoparticles to coat a thin film on the nanoparticles with the material.

In addition, the coating chamber may have a bar shape extending in a longitudinal direction, and the plurality of speed adjustment members may be installed in a linear process passage in the coating chamber at predetermined intervals.

Further, the coating chamber may have a bar shape extending in a longitudinal direction, a plurality of blocking walls may be installed in the coating chamber to form a zigzag process passage, and the plurality of speed adjustment members may be installed in the zigzag process passage.

Furthermore, the coating chamber may have a cylindrical shape, a plurality of blocking walls may be concentrically installed in the coating chamber to form a spiral process passage, and the plurality of speed adjustment members may be installed in the spiral process passage.

In addition, the coating chamber may include a first branch chamber and a second branch chamber branched off at an inlet of the coating chamber, a first gate that is able to be opened and closed may be installed at a passage connecting one side of the first branch chamber and one side of the second branch chamber, a second gate that is able to be opened and closed may be installed at a passage connecting the other side of the first branch chamber and the other side of the second branch chamber, and an opening/closing operation of the first and second gates may be controlled to perform a coating process using both of the first and second branch chambers or any one of the branch chambers.

Further, when the opening/closing operation of the first and second gates is controlled to use both of the first and second branch chambers, a reaction cycle constituted by a primary process of supplying the first precursor into the first branch chamber and a secondary process of supplying the second precursor into the second branch chamber may be periodically performed.

Furthermore, the gas supply means and the low pressure forming means may be installed at one side and the other side of the linear process passage of the coating chamber, a reaction cycle constituted by a primary process of supplying the first precursor to one side of the linear process passage to move in a first process progress direction and a secondary process of supplying the second precursor to the other side of the linear process passage to move in a second process progress direction may be periodically performed, and the first and second process progress directions may have starting points and ending points that are opposite to each other.

In addition, the apparatus may further include: a common connecting chamber installed at an inlet of the coating chamber; a plurality of branch chambers branched off from the common connecting chamber; and a plurality of gates installed at inlets of the plurality of branch chambers to be opened and closed, wherein opening/closing operations of the plurality of gates are controlled to independently perform the coating process in the plurality of branch chambers.

Further, the particle supply means may be a valve, the gas supply means may include a first gas supply valve configured to supply a carrier gas, and a second gas supply valve configured to alternately supply or individually supply first and second precursors, and the low pressure forming means may be a vacuum pump.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 3A is a schematic view of a coating chamber having a zigzag process passage, and FIG. 3B is a schematic view of a coating chamber having a spiral process passage, for describing a structure of a coating chamber according to another embodiment of the present invention;

DETAILED DESCRIPTION OF EXEMPLARY EMBODIMENTS

Hereinafter, an embodiment of the present invention will be described in detail with reference to the accompanying drawings.

Figure 1:
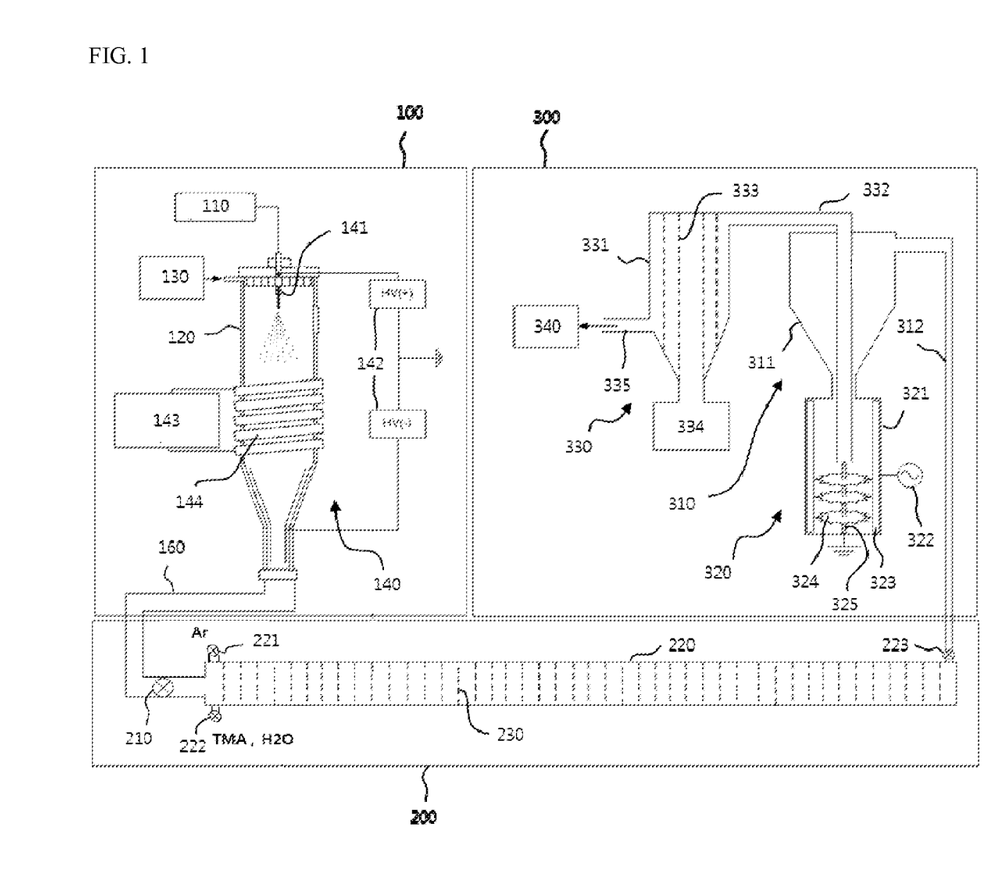
FIG. 1 is a configuration view of an in situ system for manufacturing nanoparticles having a core-shell structure to which the present invention is applied.

As shown in FIG. 1, an in situ system for manufacturing nanoparticles having a core-shell structure to which the present invention is applied includes a nanoparticle generating apparatus 100 for generating nanoparticles in a reaction chamber using low pressure plasma, a nanoparticle coating apparatus 200 for coating a shell material on surfaces of the nanoparticles by supplying the nanoparticles and a reactive gas serving as a source of the shell material into a coating chamber, and a core-shell nanoparticle collecting apparatus 300 for collecting the nanoparticles having a core-shell structure coated with the shell material.

The nanoparticle generating apparatus 100, the nanoparticle coating apparatus 200 and the core-shell nanoparticle collecting apparatus 300 connect the respective processes to continuously process the processes. In the embodiment, while a method of generating nanoparticles by applying a radio frequency inductively coupled plasma (ICP) method by the nanoparticle generating apparatus 100 is exemplified, generation of the nanoparticles should not be limited to a specific method.

The nanoparticle generating apparatus 100 includes a fluid supply pump 110, a reaction chamber 120, a gas supply source 130 and a low pressure plasma generator 140.

The fluid supply pump 110 supplies a precursor in a liquid phase serving as a spray sample of nanoparticles. Here, the precursor in the liquid phase may be appropriately selected according to a kind of nanoparticles serving as a core material. The fluid supply pump 110 can supply the precursor in the liquid phase into an electrospray nozzle 141 installed at one side of the reaction chamber 120 to perform an electrospray process.

The electrospray nozzle 141 injects the precursor in the liquid phase into the reaction chamber 120, and the gas supply source 130 supplies the carrier gas and the reactive gas into the reaction chamber 120. Here, Ar may be used as the carrier gas, and $O_2$, $NH_3$, $H_2O$, or the like, may be used as the reactive gas.

The low pressure plasma generator 140 includes a direct current high voltage supply coil 142 configured to supply a direct current high voltage between the electrospray nozzle 141 and the reaction chamber 120, and an RF matching box 143 configured to match impedance of the reaction chamber 120 using a radio frequency generated from an induction coil 144 surrounding the reaction chamber 120, in order to generate low pressure plasma in the reaction chamber 120.

The precursor melted in the solvent in the liquid phase forms nano drops and is injected into the reaction chamber 120 by a high voltage applied to the reaction chamber 120. Here, as low pressure plasma (cold plasma) is generated in the reaction chamber 120 by the low pressure plasma generator 140, a carrier gas (Ar) and a reactive gas ($O_2$, $NH_3$, $H_2O$, or the like) supplied from the gas supply source 130 are activated to generate a reaction radical, and the reaction radical reacts with the nano drops to generate nanoparticles. The nanoparticles may be a metal oxide, a metal nitride, or the like. Here, the solvent serving as the medium of the nano drops is vaporized by the plasma to first exit the reaction chamber 120. Here, the low pressure plasma is generated in the reaction chamber 120 so that sufficient reaction energy can be supplied to the nano drops even at a low temperature, and mass production of the nanoparticles in an inert gas or vacuum state becomes possible.

The generated nanoparticles are transmitted to the nanoparticle coating apparatus 200 via a connecting chamber 160, and supplied into a coating chamber 220 through a particle supply means 210 installed at the connecting chamber 160. Here, the particle supply means 210 may be implemented as a valve.

The nanoparticle coating apparatus 200 can coat the shell material through atomic layer deposition. The atomic layer deposition can deposit a thin film of a nano thickness having good uniformity on the surface of the nanoparticles having a three-dimensional structure. A plurality of reactive gases can be alternately supplied as a source of a shell material required for thin film deposition.

The nanoparticle coating apparatus 200 includes the coating chamber 220 having a process passage in which a substantial coating process of the nanoparticles is performed, gas supply means 221 and 222 configured to supply a carrier gas and a reactive gas serving as a source of a shell material into the process passage, and a low pressure forming means 223 installed at one side of the coating chamber 220 and configured to form a pressure in the process passage at a low pressure. In addition, a speed adjustment member 230 formed of a porous material or in a grid is installed in the process passage of the coating chamber 220.

The gas supply means may be constituted by a first gas supply valve 221 configured to supply a carrier gas, and a second gas supply valve 222 configured to supply a reactive gas serving as a source of a shell material, and the low pressure forming means may be implemented as a vacuum pump 223.

The core-shell nanoparticle collecting apparatus 300 includes a cyclone collector 310, an electrostatic collector 320 and a particle collector 330.

The cyclone collector 310 includes a cylindrical tank 311 connected to the vacuum pump 223 via a connecting chamber 312 installed to come in communication with an upper end thereof. The core-shell nanoparticles have a larger mass than the carrier gas, and are introduced into the upper end of the cylindrical tank 311 via the connecting chamber 312 to be classified by a centrifugal force to be primarily collected.

The electrostatic collector 320 includes an ionization reaction chamber 321 connected to come in communication with a lower end of the cylindrical tank 311, an electrode member constituted by a high pressure electrode 323 and a ground electrode 324 installed at the ionization reaction chamber 321, and an alternating current high voltage supply coil 322 configured to supply an alternating current high voltage to the high pressure electrode 323.

The electrostatic collector 320 can apply a high voltage to core-shell nanoparticles introduced into the ionization reaction chamber 321 from the lower end of the cylindrical tank 311 to ionize the nanoparticles with anions or cations to collect the nanoparticles. Here, the ground electrode 324 includes a plurality of disk-shaped conductive plates installed in an axial direction of a support section 325. A periphery of the conductive plates has a sharp serration shape in order to increase ionization efficiency by the high voltage.

The particle collector 330 can receive the core-shell nanoparticles collected by the electrostatic collector 320 to finally collect and store the nanoparticles.

The particle collector 330 includes a guide pipe 332, a separating container 331, a grid 333, a storage container 334 and a discharge pipe 335. A discharge pump 340 is connected to the separating container 331 through the discharge pipe 335.

One side of the guide pipe 332 extends to the inside of the ionization reaction chamber 321 through the cylindrical tank 311, and the other side is connected to the upper end of the separating container 331. The grid 333 is installed in the separating container 331 in a vertical direction, and the plurality of grids 333 are installed in parallel in layers at predetermined intervals. Since the grid 333 has fine holes of a nano size, the carrier gas and the reactive gas introduced into an ionization reaction chamber 321 through the connecting chamber 312 can be discharged to the discharge pipe 335.

The storage container 334 is installed at a center lower end of the separating container 331 to be in communication with the inside thereof, and the core-shell nanoparticles having a moving speed decreased while passing through the plurality of grids 333 are gathered and finally collected in the storage container 334. Accordingly, the core-shell nanoparticles and the carrier gas ionized and collected in the ionization reaction chamber 321 by the discharge pump 340 are introduced into the separating container 331 through the guide pipe 332, the carrier gas is discharged through the discharge pipe 335, and core-shell nanoparticles are gathered and finally collected in the storage container 334.

Figure 2:
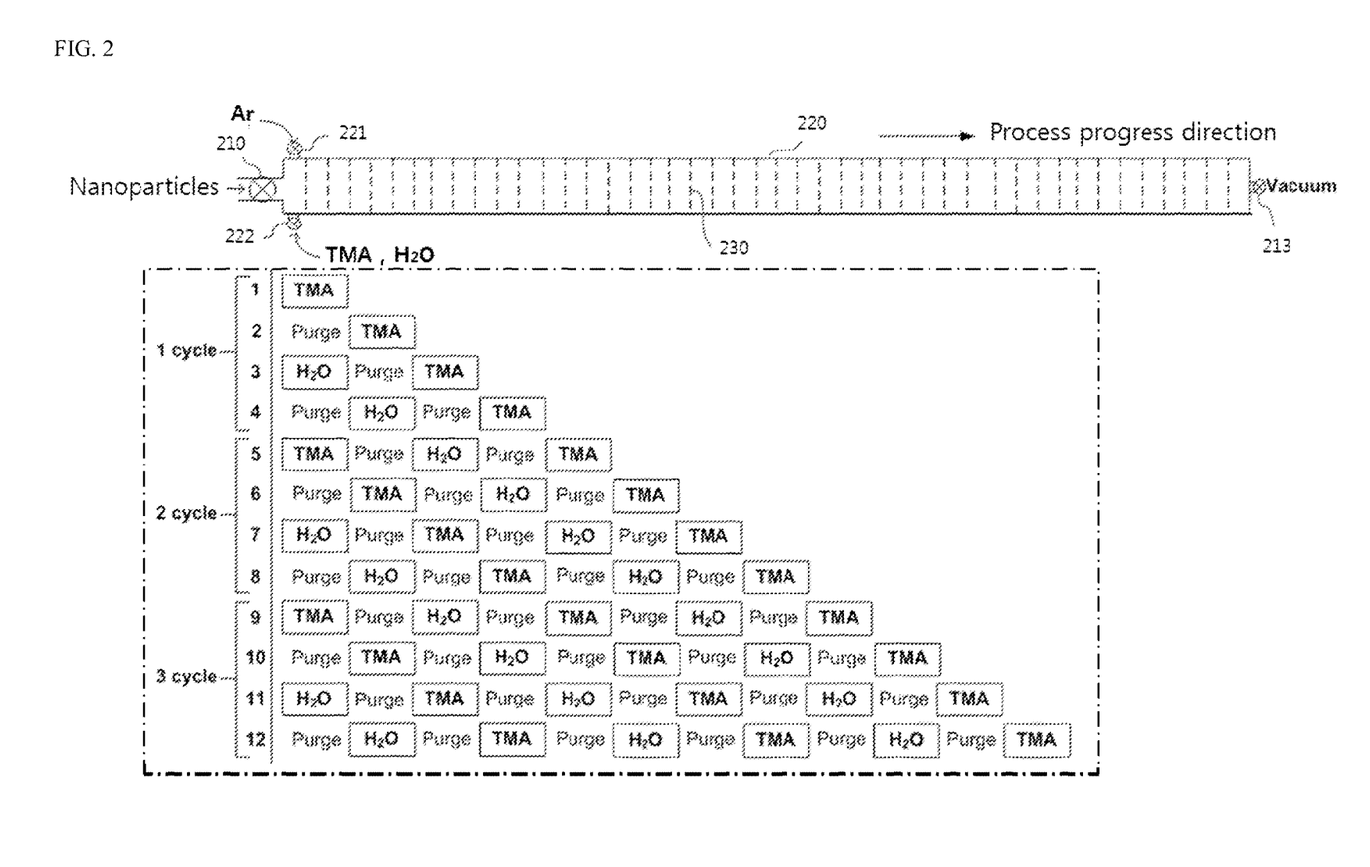
FIG. 2 is a view for describing an operation of alternately supplying first and second precursors serving as a reactive gas to coat a shell material in an apparatus for coating nanoparticles having a core-shell structure using atomic layer deposition according to an embodiment of the present invention.

FIG. 2 is a view for describing an operation of alternately supplying first and second precursors serving as a reactive gas and coating a shell material in an apparatus for coating nanoparticles having a core-shell structure using atomic layer deposition according to an embodiment of the present invention.

The coating chamber 220 has a bar shape extending in a longitudinal direction, and the plurality of speed adjustment members 230 may be installed in a linear process passage in the coating chamber at predetermined intervals.

The carrier gas supplied through the first gas supply valve 221 is an inert gas, and the reactive gas supplied through the second gas supply valve 222 is a first precursor and a second precursor for forming a shell material of a thin film. The second gas supply valve 222 is connected to a precursor supply source (not shown) configured to supply the first precursor and the second precursor such that the first and second precursors can be alternately supplied by selectively supplying only the first precursor of the two precursors by opening a first flow path configured to supply one precursor and closing a second flow path configured to supply the other precursor, and on the other hand, selectively supplying only the second precursor by closing the first flow path and opening the second flow path. Here, the carrier gas, which is Ar serving as an inert gas, is supplied from the first gas supply valve 221, and when an aluminum oxide ($Al_2O_3$) thin film is coated with a shell material, TMA (trimethylaluminum), which is a first precursor serving as an aluminum source, and $H_2O$, which is a second precursor serving as an oxygen source, can be alternately supplied from the second gas supply valve 222.

When the valve 210 is opened and the vacuum pump 223 is operated, the generated nanoparticles are introduced into the coating chamber 220 to move along the process passage in one direction, and at this time, the carrier gas and the reactive gas can be supplied into the coating chamber 220.

In order to coat a shell material as a thin film using atomic layer deposition, the first precursor and the second precursor serving as the reactive gas should move past the foregoing nanoparticles. Since the shell material is deposited in layers and gradually thickened by reaction of the first and second precursors, in order to secure a certain coating thickness, the reactive gas should move relatively rapidly while a moving speed of the nanoparticles is decreased. That is, when the first precursor moves more rapidly than the nanoparticles introduced into the process passage to come in contact with the surface of the three-dimensional nanoparticles, and the second precursor supplied thereafter moves more rapidly than the nanoparticles to come in contact with the surface of the three-dimensional nanoparticles, thin film coating of the shell material by the reaction of the first precursor and the second precursor can be performed.

In order to adjust the moving speed of the nanoparticles and the reactive gas as described above, the speed adjustment member 230 is installed at the process passage of the coating chamber 220.

The plurality of speed adjustment members 230 may be installed in the longitudinal direction of the process passage at predetermined intervals, and may be formed of a porous material or in a grid structure. The speed adjustment member 230 has fine holes through which nanoparticles having a certain volume can pass, and the fine holes are set to a nano size such that the moving speed of the moving nanoparticles can be decreased due to flow resistance or collision while the nanoparticles pass through the speed adjustment member 230.

Since the carrier gas or the reactive gas has a relatively small volume, the carrier gas or the reactive gas moves with less resistance against the speed adjustment member 230. Accordingly, the moving speed of the first precursor and the second precursor serving as the reactive gas conveyed by the carrier gas is remarkably higher than the moving speed of the nanoparticles.

A supply period of the reactive gas is set to correspond to a coating thickness of the shell material coated on the nanoparticles. As shown in FIG. 2, while TMA (trimethylaluminum), which is a first precursor serving as an aluminum source, and $H_2O$, which is a second precursor serving as an oxygen source, are alternately supplied, reactants or byproducts generated by stopping supply of the two precursors whenever one precursor is supplied can be discharged to the outside of the coating chamber 220. This serves to exclude irregular deposition due to the reactants or byproducts as well as allowing the nanoparticles to move without being fixed to a specific position.

The shell material of 0.5 to 1 Å can be uniformly coated on the three-dimensional nanoparticles in each coating process of one reaction cycle in which the first and second precursors are alternately supplied, and the nanoparticles having the core-shell structure coated with the shell material in the nanoparticle coating apparatus 200 are conveyed to the core-shell nanoparticle collecting apparatus 300.

Figure 3:
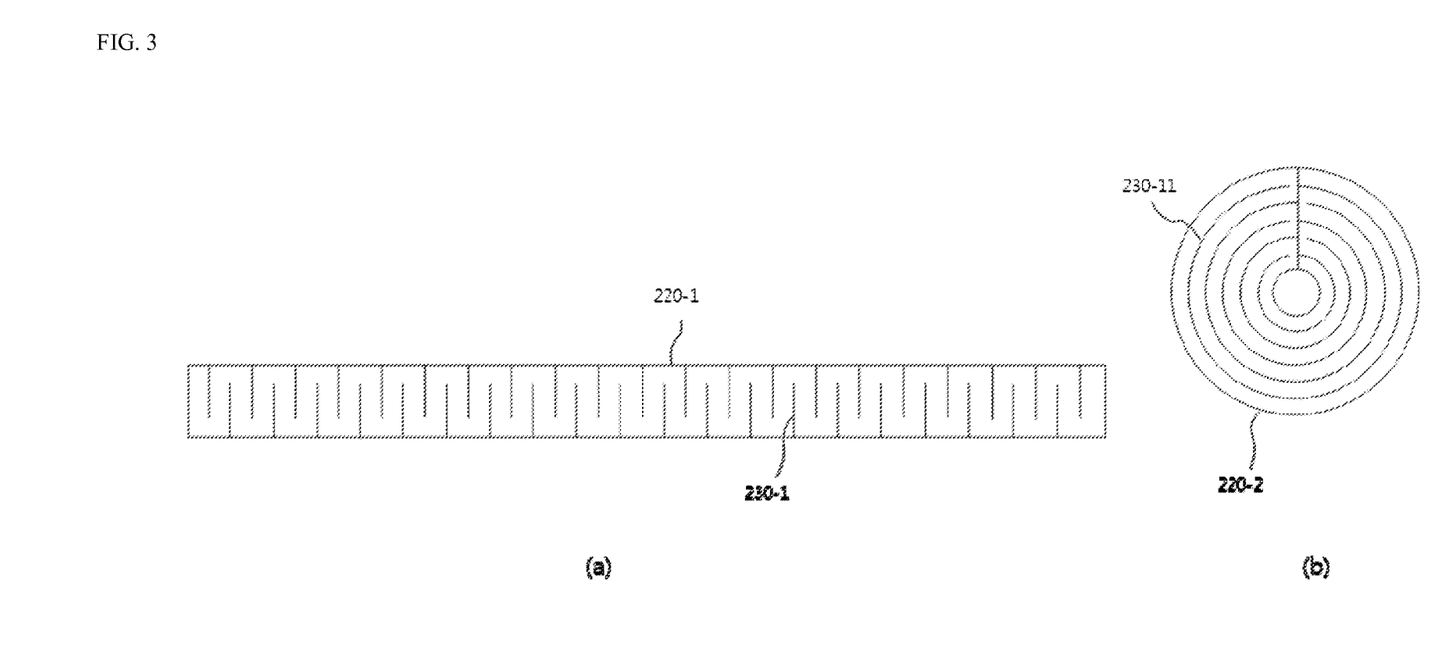

FIG. 3 is a view for describing a structure of a coating chamber according to another embodiment of the present invention.

As shown in FIG. 3A, a coating chamber 220-1 has a bar shape extending in a longitudinal direction. A plurality of blocking walls 230-1 are installed at predetermined intervals in order to form a zigzag process passage in the coating chamber, and a plurality of speed adjustment members 230-2 may be installed in the zigzag process passage.

In addition, as shown in FIG. 3B, the coating chamber 220-2 has a cylindrical shape, a plurality of blocking walls 230-11 are concentrically installed to form a spiral process passage in the coating chamber, and a plurality of speed adjustment members 230-12 may be installed in the spiral process passage.

Spatial efficiency can be increased by changing a process passage structure of the coating chambers 220-1 and 220-2.

Hereinafter, structures of the coating chamber applied to various modifications of the nanoparticle coating apparatus will be described.

Figure 4:
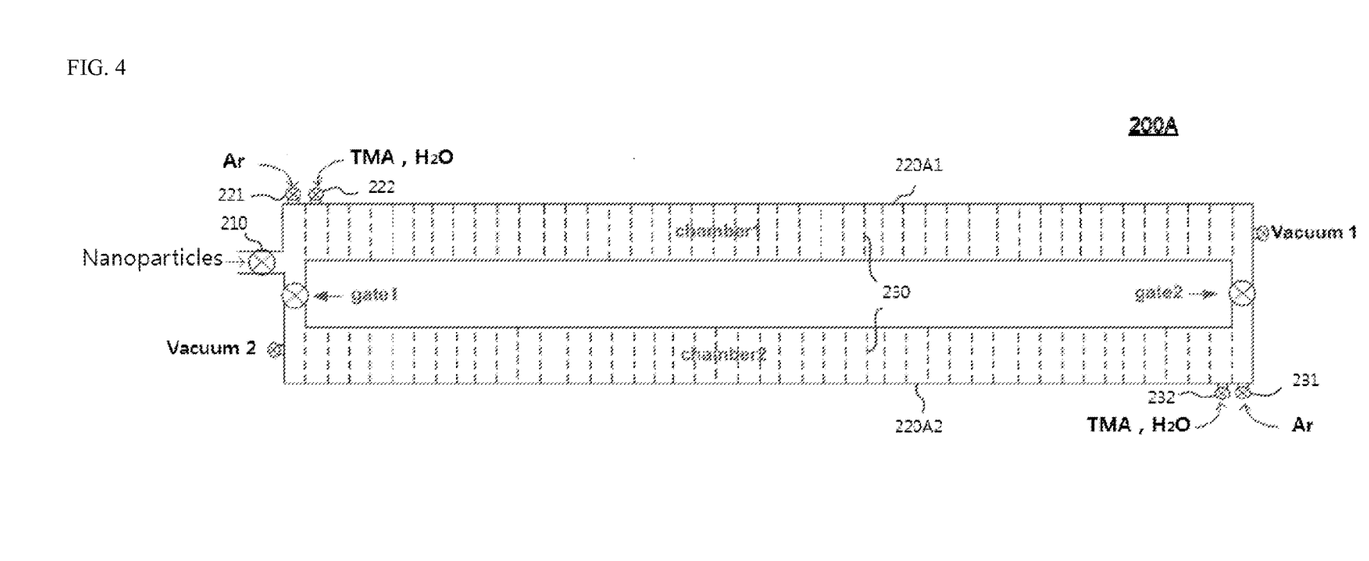
FIG. 4 is a view showing a configuration in which the coating chamber is implemented by a plurality of branch chambers to flexibly vary a length of the process passage, for describing a structure of a coating chamber according to another embodiment of the present invention.

FIG. 4 is a view for describing a structure of a coating chamber according to another embodiment of the present invention, showing a configuration in which the coating chamber is constituted by a plurality of branch chambers and a length of a process passage is flexibly varied. The same components configured to perform the same functions as in the above-mentioned embodiment are designated by the same reference numerals.

A nanoparticle coating apparatus 200A shown in FIG. 4 includes a first branch chamber 220A1 and a second branch chamber 200A2 branched off from an inlet of the coating chamber.

A first gate gate1, which can be opened and closed, is installed at a passage configured to connect one side of the first branch chamber 220A1 and one side of the second branch chamber 200A2, and a second gate gate2, which can be opened and closed, is installed at a passage configured to connect the other side of the first branch chamber 220A1 and the other side of the second branch chamber 200A2.

The first and second gates gate1 and gate2 may be implemented as opening/closing valves.

When the number of reaction cycles of the coating process is large, a length of the process passage may be increased. Here, an opening/closing operation of the first and second gates gate1 and gate2 may be controlled to perform the coating process using both of the first and second branch chambers 220A1 and 220A2. For example, if the first gate gate1 is closed and a vacuum pump Vacuum1 is operated when a certain amount of nanoparticles are supplied into the first branch chamber 220A1 through the valve 210, the coating process can be performed in the first branch chamber 220A1 using the carrier gas (Ar) supplied through the first and second gas supply valves 221 and 222 and the reactive gases (TMA, $H_2O$), which are alternately supplied. When the coating process cannot be easily performed autonomously using only the first branch chamber 220A1, the second gate gate2 is opened and the vacuum pump Vacuum1 of the first branch chamber 220A1 is turned off, and when the vacuum pump Vacuum2 of the second branch chamber 200A2 is operated and the second gate gate2 is closed after a certain time elapses after the nanoparticles pass through the second gate gate2, the coating process can be performed in the second branch chamber 200A2 using the carrier gas (Ar) supplied through the first and second gas supply valves 231 and 232 and the reactive gases (TMA, $H_2O$), which are alternately supplied. When the coating process is insufficient even while additionally using the second branch chamber 200A2, the first gate gate1 is opened again, a vacuum pump Vacuum2 of the second branch chamber 200A2 is turned off and the vacuum pump Vacuum1 of the first branch chamber 220A1 is operated to perform the coating process using the first branch chamber 220A1. As described above, since all of the plurality of branch chambers or any one of the branch chambers can be used by controlling the opening/closing operation of the first and second gates gate1 and gate2, the length of the process passage can be flexibly varied to correspond to the coating process.

Figure 5:
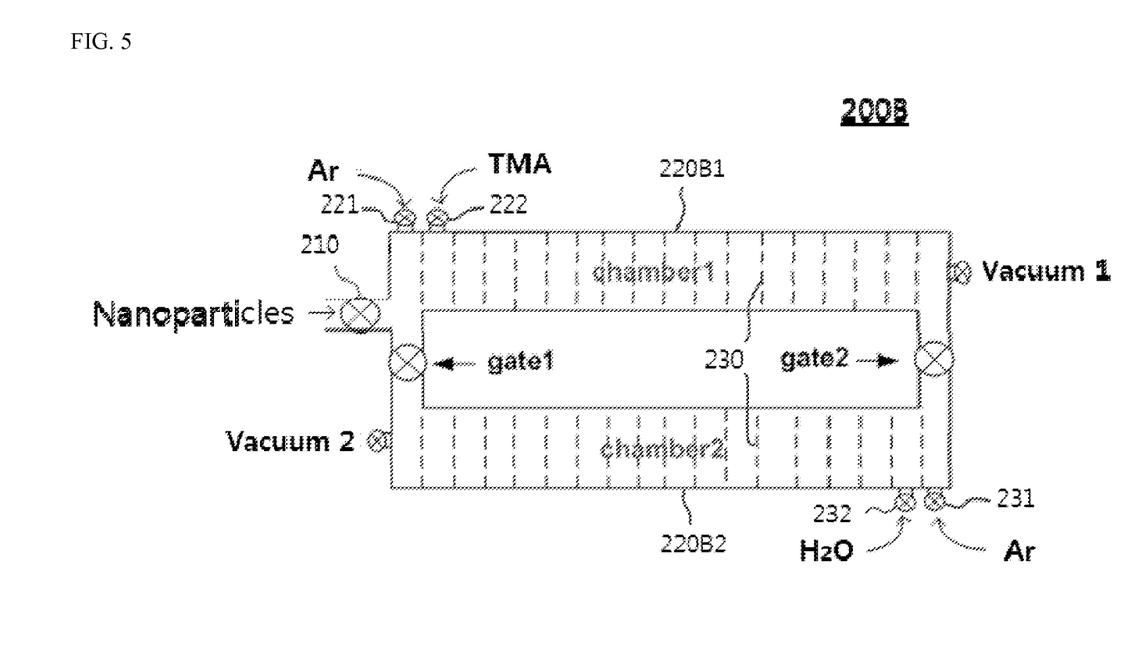
FIG. 5 is a view showing a configuration in which a coating process is performed to circulate the plurality of branch chambers corresponding to first and second precursors serving as a reactive gas, for describing a structure of a coating chamber according to another embodiment of the present invention.

FIG. 5 is a view for describing a structure of a coating chamber according to another embodiment of the present invention, showing a configuration in which a coating process is performed to circulate a plurality of branch chambers corresponding to first and second precursors serving as a reactive gas. The same components configured to perform the same functions as in the above-mentioned embodiment are designated by the same reference numerals.

A nanoparticle coating apparatus 200B shown in FIG. 5 includes a first branch chamber 220B1 and a second branch chamber 200B2, which are branched off from an inlet of the coating chamber.

When an opening/closing operation of the first and second gates gate1 and gate2 is controlled to use both of the first and second branch chambers 220B1 and 220B2, a reaction cycle in which a primary process of supplying a carrier gas (Ar) and a first precursor (TMA) into the first branch chamber 220B1 is performed and a secondary process of supplying a carrier gas (Ar) and a second precursor ($H_2O$) into the second branch chamber 220B2 is performed after the primary process can be periodically performed to perform the coating process. Here, an opening/closing time of the first and second gates gate1 and gate2 can be appropriately adjusted, and the coating process may be simultaneously performed in the first branch chamber 220B1 and the second branch chamber 220B2.

As the coating process is performed individually using exclusive precursors with respect to the plurality of branch chambers, contamination of the branch chambers due to reactants can be reduced.

Figure 6:
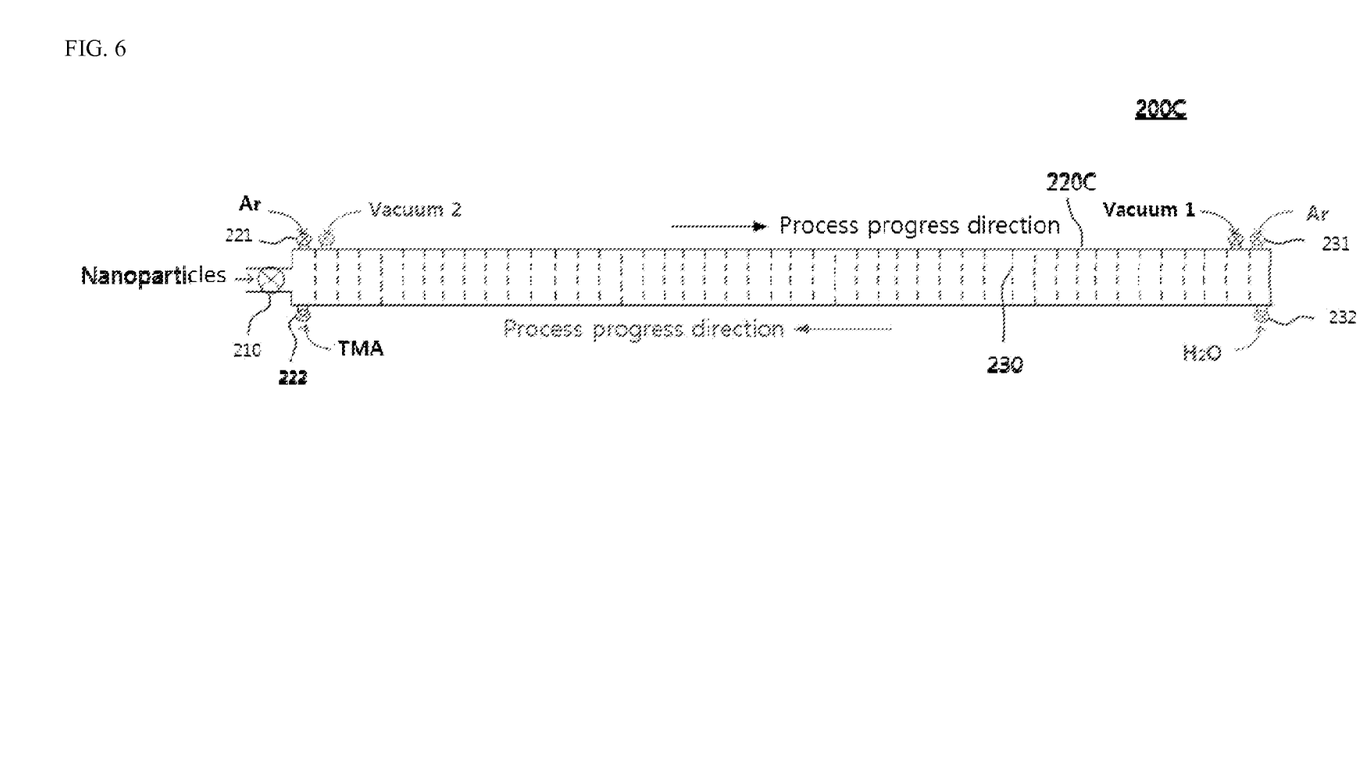
FIG. 6 is a view for describing a configuration in which a coating process is performed to reciprocate in a single process passage corresponding to first and second precursors serving as a reactive gas in a structure of a coating chamber according to another embodiment of the present invention.

FIG. 6 is a view for describing a structure of a coating chamber according to another embodiment of the present invention, showing a configuration in which a coating process is performed to reciprocate a single process passage to correspond to first and second precursors serving as a reactive gas. The same components configured to perform the same functions as in the above-mentioned embodiment are designated by the same reference numerals.

A nanoparticle coating apparatus 200C shown in FIG. 6 includes a coating chamber 220C provided with a linear process passage.

Gas supply means 221, 222, 231 and 232 and low pressure forming means Vacuum1 and Vacuum2 are installed at one side and the other side of the coating chamber 220C.

A carrier gas (Ar) and a first precursor (TMA) can be supplied from the one side of the coating chamber 220C and the vacuum pump Vacuum1 can be operated to perform a primary process moving in a first process progress direction (a black arrow). Then, a carrier gas (Ar) and a second precursor ($H_2O$) can be supplied from the other side of the coating chamber 220C and the vacuum pump Vacuum2 can be operated to perform a secondary process moving in a second process progress direction (a red arrow). A reaction cycle constituted by the primary process and the secondary process can be periodically performed.

Here, the vacuum pump Vacuum2 is turned off during the primary process, and the vacuum pump Vacuum1 is turned off during the secondary process. Here, the first and second process progress directions have starting points and ending points that are opposite to each other.

Figure 7:
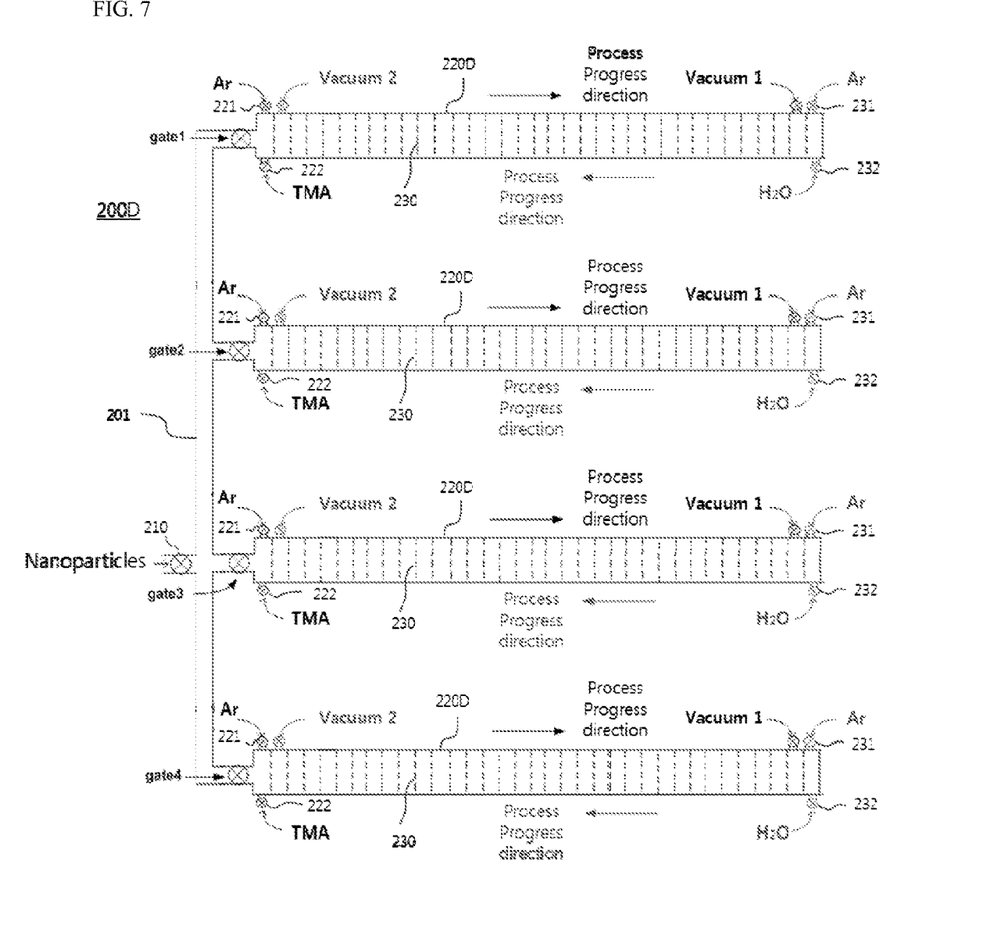
FIG. 7 is a view for describing a configuration in which a coating process is independently performed in a plurality of branch chambers branched off from a common connecting chamber in a structure of a coating chamber according to another embodiment of the present invention.

FIG. 7 is a view for describing a structure of a coating chamber according to another embodiment of the present invention, showing a configuration in which a coating process is independently performed in a plurality of branch chambers branched off from a common connecting chamber. The same components configured to perform the same functions as in the above-mentioned embodiment are designated by the same reference numerals.

A nanoparticle coating apparatus 200D shown in FIG. 7 further includes a common connecting chamber 201 installed at an inlet of a coating chamber, a plurality of linear branch chambers 220D branched off from the common connecting chamber 201, and a plurality of gates gate1, gate2, gate3 and gate4 installed at inlets of the plurality of branch chambers to be opened and closed. Gas supply means 221, 222, 231 and 232 and low pressure forming means Vacuum1 and Vacuum2 are installed at one sides and the other sides of the plurality of branch chambers 220D.

Opening and closing operations of the plurality of gates gate1, gate2, gate3 and gate4 can be controlled to independently perform the coating process in the plurality of branch chambers 200D. For example, the gate gate1 is opened and the other gates gate2, gate3 and gate4 are closed such that the nanoparticles introduced through the valve 210 can be supplied into the one branch chamber 220D. In addition, as described in FIG. 6, the process progress direction can be changed according to the primary process and the secondary process to periodically perform the reaction cycle. Accordingly, since the coating process can be independently performed using the plurality of branch chambers to increase productivity, the present invention is appropriate for mass production.

As can be seen from the foregoing, the apparatus for coating nanoparticles having a core-shell structure using atomic layer deposition according to the present invention can implement the coating chamber in which a thin film can be coated on the nanoparticles with the shell material in various ways, and the coating chamber appropriate for installation environments or process conditions can be applied to increase productivity.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An apparatus for coating nanoparticles having a core-shell structure using atomic layer deposition, the apparatus comprising:
   a particle supply means configured to supply the nanoparticles into a process passage, wherein the nanoparticles are formed by a lower pressure plasma generator:
   a coating chamber having the process passage being pluralized by branching off from an inlet of the coating chamber based on a coating process of a reaction cycle corresponding to a coating thickness of the nanoparticles in the process passage in which the coating process is performed by circulating the nanoparticles in the process passage;

a gas supply means configured to supply a carrier gas and a reactive gas serving as a source of a shell material into the process passage, wherein a thin film is coated on the nanoparticles with the shell material;

at least one low pressure forming means installed in the coating chamber and configured to form a low pressure in the process passage so that the nanoparticies, the reactive gas, and the carrier gas are moved along the process passage: and each of a plurality of speed adjustment members formed of a porous material having nano-sized fine holes which the nanoparticles, the reactive gas, and the carrier gas are passed through, wherein the plurality of speed adjustment members are installed in the longitudinal direction of the process passage at predetermined intervals in order to adjust a moving speed of the nanoparticles, carrier gas, and the reactive gas, wherein the moving speed of the nanoparticles is decreased due to flow resistance or collision of the nanoparticles passing through the speed adjustment member, first and second precursors supplied as the reactive gas move more rapidly than the nanoparticles to coat the thin film on the nanoparticles with said shell material.

2. The apparatus for coating the nanoparticles having the core-shell structure using atomic layer deposition according to claim 1, wherein the coating chamber has a bar shape extending in a longitudinal direction.

3. The apparatus for coating the nanoparticles having the core-shell structure using atomic layer deposition according to claim 1, wherein the coating chamber has a bar shape extending in a longitudinal direction, and a plurality of blocking walls are installed in the coating chamber to form a zigzag process passage, and the plurality of speed adjustment members are installed in the zigzag process passage.

4. The apparatus for coating the nanoparticles having the core-shell structure using atomic layer deposition according to claim 1, wherein the coating chamber has a cylindrical shape, and a plurality of blocking walls are concentrically installed in the coating chamber to form a spiral process passage, and the plurality of speed adjustment members are installed in the spiral process passage.

5. The apparatus for coating the nanoparticles having the core-shell structure using atomic layer deposition according to claim 1, wherein the coating chamber comprises a first branch chamber and a second branch chamber branched off at an inlet of the coating chamber, a first gate that is able to be opened and closed is installed at a passage connecting one side of the first branch chamber and one side of the second branch chamber, and a second gate that is able to be opened and closed is installed at a passage connecting the other side of the first branch chamber and the other side of the second branch chamber, and an opening/closing operation of the first and second gates is controlled to perform a coating process using both of the first and second branch chambers or any one of the branch chambers.

6. The apparatus for coating the nanoparticles having the core-shell structure using atomic layer deposition according to claim 5, wherein, when the opening/closing operation of the first and second gate is controlled to use both of the first and second branch chambers, a reaction cycle constituted by a primary process of supplying the first precursor into the first branch chamber and a secondary process of supplying the second precursor into the second branch chamber is periodically performed.

7. The apparatus for coating the nanoparticles having the core-shell structure using atomic layer deposition according to claim 2, wherein the gas supply means and the low pressure forming means are installed at one side and the other side of the linear process passage of the coating chamber, a reaction cycle constituted by a primary process of supplying the first precursor to one side of the linear process passage to move in a first process progress direction and a secondary process of supplying the second precursor to the other side of the linear process passage to move in a second process progress direction is periodically performed, and the first and second process progress directions have starting points and ending points that are opposite to each other.

8. The apparatus for coating the nanoparticles having the core-shell structure using atomic layer deposition according to claim 7, further comprising:

a common connecting chamber installed at an inlet of the coating chamber;

a plurality of branch chambers branched off from the common connecting chamber; and a plurality of gates installed at inlets of the plurality of branch chambers to be opened and closed, wherein opening/closing operations of the plurality of gates are controlled to independently perform the coating process in the plurality of branch chambers.

9. The apparatus for coating the nanoparticles having the core-shell structure using atomic layer deposition according to claim 1, wherein the particle supply means is a valve, the gas supply means comprises a first gas supply valve configured to supply a carrier gas, and a second gas supply valve configured to alternately supply or individually supply first and second precursors, and the low pressure forming means is a vacuum pump.

* * * * *